United States Patent
Tsumura et al.

(10) Patent No.: US 7,795,733 B2
(45) Date of Patent: Sep. 14, 2010

(54) SEMICONDUCTOR DEVICE HAVING AERIAL WIRING AND MANUFACTURING METHOD THEREOF

(75) Inventors: Kazumichi Tsumura, Kawasaki (JP); Hideki Shibata, Yokohama (JP); Masaki Yamada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 897 days.

(21) Appl. No.: 11/399,653

(22) Filed: Apr. 7, 2006

(65) Prior Publication Data
US 2007/0035032 A1 Feb. 15, 2007

(30) Foreign Application Priority Data
Aug. 10, 2005 (JP) ............... 2005-232387

(51) Int. Cl.
*H01L 29/40* (2006.01)
(52) U.S. Cl. .............. 257/758; 257/E21.575; 257/E23.145; 438/597
(58) Field of Classification Search ........... 257/522, 257/758, 734, 741, 750, 508, 635, 637, E21.575, 257/E23.145; 438/597, 618
See application file for complete search history.

(56) References Cited

U.S. PATENT DOCUMENTS

| | | | |
|---|---|---|---|
| 6,307,265 B1 | 10/2001 | Anand et al. | |
| 6,924,222 B2 * | 8/2005 | Goodner et al. | 438/622 |
| 7,084,479 B2 * | 8/2006 | Chen et al. | 257/522 |
| 2003/0127740 A1 * | 7/2003 | Hsu et al. | 257/758 |
| 2004/0201103 A1 * | 10/2004 | Yau et al. | 257/758 |
| 2005/0218519 A1 * | 10/2005 | Koike et al. | 257/756 |

FOREIGN PATENT DOCUMENTS

| JP | 9-237831 | 9/1997 |
|---|---|---|
| JP | 2005-277390 | 10/2005 |

OTHER PUBLICATIONS

T. Usui, et al., "Low Resistive and Highly Reliable Cu Dual-Damascene Interconnect Technology Using Self-Formed $MnSi_xO_y$ Barrier Layer", Proceeding of IEEE IITC, Jun. 2005, (3 pages).
Shouichi Uno, et al., "Dual Damascene Process for Air-Gap Cu Interconnects Using Conventional CVD Films as Sacrificial Layers", Proceeding of IEEE IITC, Jun. 2005, (3 pages).
U.S. Appl. No. 11/440,453, filed May 25, 2006, Usui, et al.

\* cited by examiner

*Primary Examiner*—W. David Coleman
*Assistant Examiner*—Su C Kim
(74) *Attorney, Agent, or Firm*—Oblon, Spivak, McClelland, Maier & Neustadt, L.L.P.

(57) ABSTRACT

A semiconductor device includes a first aerial wiring including a first wiring layer which is formed in an air gap and contains Cu as a main component and a via layer which is electrically connected to the first wiring layer, is formed in an inter-level insulating film containing a preset constituent element and contains Cu as a main component, and a first porous film formed on the first aerial wiring. The semiconductor device further includes a first barrier film which is formed to cover the surface of the first aerial wiring and contains a compound of the preset constituent element and a preset metal element as a main component.

15 Claims, 5 Drawing Sheets

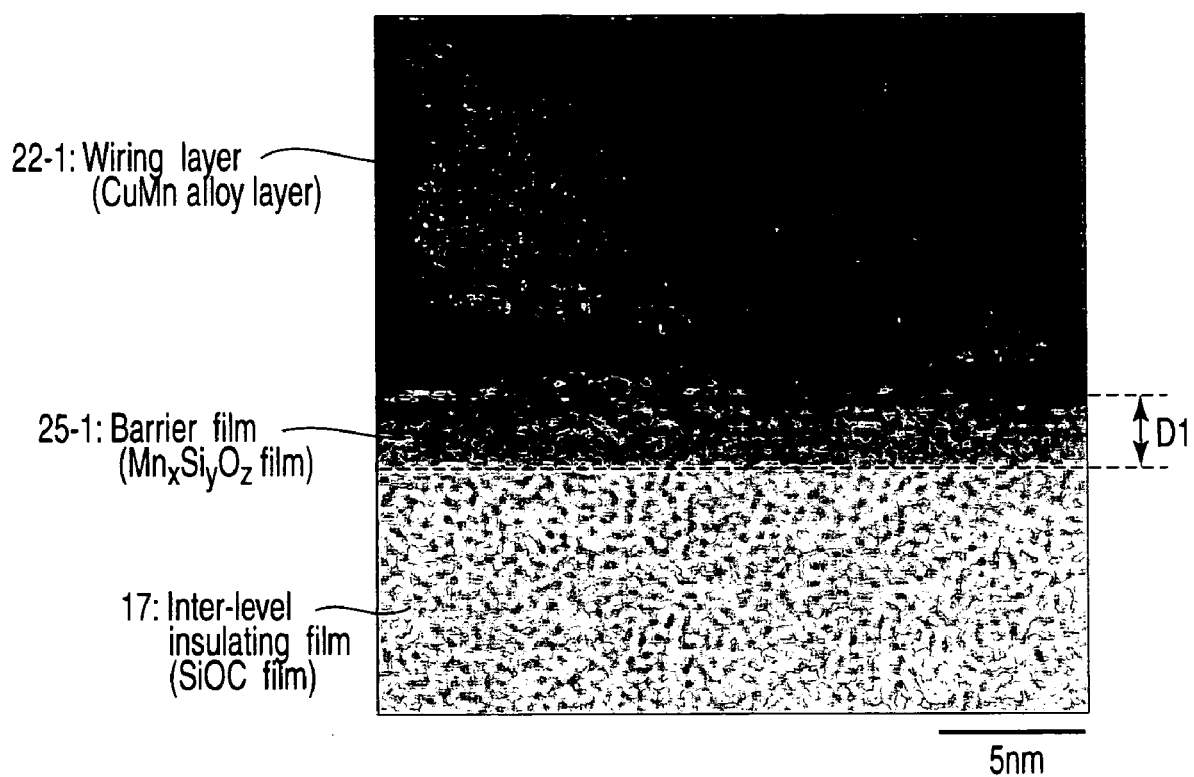
F I G. 2

SEMICONDUCTOR DEVICE HAVING AERIAL WIRING AND MANUFACTURING METHOD THEREOF

CROSS-REFERENCE TO RELATED APPLICATIONS

This application is based upon and claims the benefit of priority from prior Japanese Patent Application No. 2005-232387, filed Aug. 10, 2005, the entire contents of which are incorporated herein by reference.

BACKGROUND OF THE INVENTION

1. Field of the Invention

This invention relates to a semiconductor device and a manufacturing method thereof and is applied to a multilayer wiring using an air gap structure, for example.

2. Description of the Related Art

Conventionally, a multilayer wiring using an air gap structure is proposed (for example, refer to Jpn. Pat. Appln. KOKAI Publication No. H9-237831). The air gap structure is a structure in which a material used to isolate adjacent wirings from each other is not a solid material represented by a silicon oxide film but a gaseous material such as air.

A conventional general manufacturing method of a multi-layer wiring using the air gap structure is as follows.

First, a wiring structure is temporarily formed in an insulating film. At this time, it is general to use a carbon film or resist as a material of the insulating film. Further, it is general to form a barrier film for prevention of diffusion by use of a metal material such as Ta (tantalum) or TaN (tantalum nitride) before forming a wiring layer containing metal such as Cu (copper) or Al (aluminum) as a main component.

Then, a porous film is formed on the above wiring structure.

Next, air gaps are formed by etching portions of the insulating film between wiring layers through the porous film by using $O_2$ as etching gas.

However, since an oxide gas such as $O_2$ is used in the above etching process, the barrier film tends to be oxidized and corroded and the wiring also tends to be oxidized and corroded. This is because the barrier film and wiring are formed of a metal material, exhibit almost no oxidation resistance and are easily oxidized and corroded by an oxidation gas such as $O_2$. Particularly, when the wiring structure is formed by using Cu as a main component, the above tendency becomes significant since the Cu itself does not have oxidation resistance.

BRIEF SUMMARY OF THE INVENTION

A semiconductor device according to a first aspect of the present invention comprises a first aerial wiring which includes a first wiring layer formed in an air gap and containing Cu as a main component and a via layer electrically connected to the first wiring layer, formed in an inter-level insulating film containing a preset constituent element and containing Cu as a main component; a first porous film formed on the first aerial wiring; and a first barrier film formed to cover the surface of the first aerial wiring and containing a compound of the preset constituent element and a preset metal element as a main component.

A semiconductor device according to a second aspect of the present invention comprises a first aerial wiring which includes a first wiring layer formed in an air gap and containing Cu as a main component and a via layer electrically connected to the first wiring layer, formed in the air gap and containing Cu as a main component; a first porous film formed on the first aerial wiring; and a first barrier film formed to cover the surface of the first aerial wiring and containing a compound of a preset constituent element and a preset metal element as a main component.

A method of manufacturing a semiconductor device according to a third aspect of the present invention comprises forming grooves for wirings in an insulating film; embedding an alloy film including a preset metal element and containing Cu as a main component into the grooves; forming a porous film containing at least Si on the alloy film and insulating film; and forming an air gap by removing a portion of the insulating film by performing heat treatment together with an etching process in an atmosphere containing at least $O_2$ gas through the porous film and, at the same time, forming a barrier film containing a compound of the preset metal element, Si element and O element from the $O_2$ gas as a main component in a self-alignment fashion on the surface of the alloy film.

BRIEF DESCRIPTION OF THE SEVERAL VIEWS OF THE DRAWING

FIG. 2 is a view showing a microphotograph of a cross-sectional TEM image of a portion near a barrier film of an aerial wiring;

DETAILED DESCRIPTION OF THE INVENTION

There will now be described embodiments of this invention with reference to the accompanying drawings. In this explanation, common reference symbols are attached to like portions throughout the drawings.

First Embodiment

Figure 1:
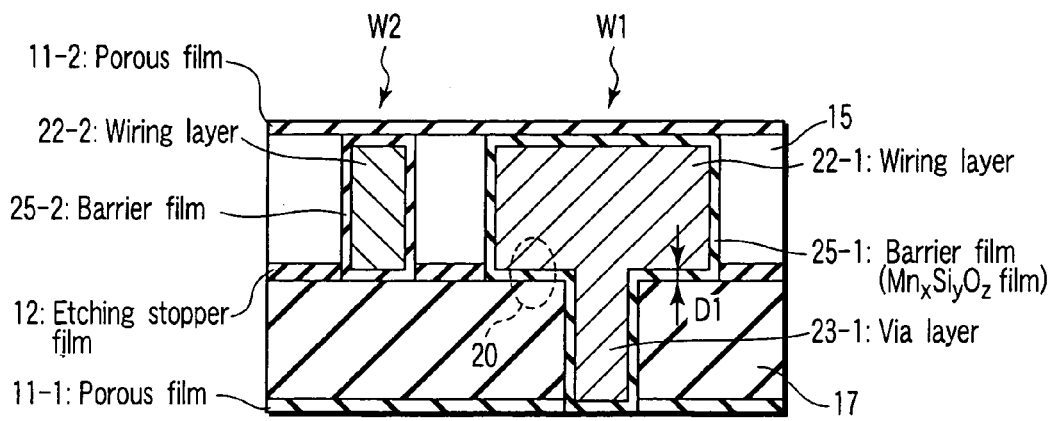
FIG. 1 is a cross-sectional view showing a semiconductor device according to a first embodiment of this invention.

First, a semiconductor device according to a first embodiment of this invention is explained with reference to FIGS. 1 and 2. FIG. 1 is a cross-sectional view showing the semiconductor device according to the present embodiment of this invention.

As shown in FIGS. 1 and 2, aerial wirings W1, W2 are provided in an inter-level insulating film 17 or air gap 15. The wirings W1, W2 are a multilayer wiring having substantially the same structures laminated on a semiconductor substrate such as a silicon substrate in practice. However, in this explanation, only part of the multilayer wiring is extracted and explained and the other portions thereof and the explanation thereof are omitted.

The aerial wiring W1 includes a wiring layer 22-1 formed in the air gap 15 and containing Cu as a main component (that is, 50 at % or more) and a via layer 23-1 electrically connected to the wiring layer 22-1, formed in the inter-level insulating film 17 and containing Cu as a main component.

The aerial wiring W2 includes a wiring layer 22-2 formed in the air gap 15 and containing Cu as a main component (that is, 50 at % or more). In the cross section, the via layer of the aerial wiring W2 is not shown.

In the air gap 15, a material used to isolate adjacent wirings from each other is not a solid material represented by a silicon oxide film but a gaseous material such as air, for example.

A porous film 11-2 is formed on the aerial wirings W1, W2. Specifically, the porous film 11-2 is formed of a porous Si film, for example.

The inter-level insulating film 17 is an SiOC film or the like which is one type of an inter-level insulating film with a small dielectric constant (a so-called low-k film).

A porous film 11-1 is formed near the bottom portion of the aerial wiring W1. Specifically, the porous film 11-1 is formed of a porous Si film, for example.

Barrier films 25-1, 25-2 are formed to cover the surfaces of the aerial wirings W1, W2. Each of the barrier films 25-1, 25-2 contains a compound of a preset constituent element (for example, Si, O) and a preset metal element α (for example, Mn) as a main component and is formed in a self-alignment fashion. In this example, it is formed of an $Mn_xSi_yO_z$ (manganese silicon oxide) film. The composition of the $Mn_xSi_yO_z$ film is specifically expressed by 1:1:3 to 1:3:5 as x:y:z of $Mn_xSi_yO_z$. Further, the barrier films 25-1, 25-2 function as barriers which prevent diffusion of Cu (copper) in the wiring layers 22-1, 22-2 and via layer 23-1.

In this case, the barrier films 25-1, 25-2 are more specifically explained with reference to FIG. 2. FIG. 2 is a view showing a microphotograph of a cross-sectional TEM image of a portion near the barrier film 25-1 of the aerial wiring W1. In this explanation, a case wherein the barrier film 25-1 is used as an example is explained.

As shown in FIG. 2, the barrier film 25-1 is a thin and uniform $Mn_xSi_yO_z$ film and the film thickness Dl is approximately 2 to 3 nm.

The preset metal element α is not limited to Mn as in the present embodiment and may be an element selected from a group consisting of Nb, Zr, Cr, V, Y, Tc and Re. Each of the above metal elements α is a metal element which has diffusion speed higher than Cu in a layer containing Cu and tends to more easily react with oxygen than Cu to form a thermally stabilized oxide.

The preset constituent element can contain O and at least one element selected from a group consisting of Si, C and F. As a specific material, for example, $SiO_2$, $SiO_xC_y$, $SiO_xC_yH_z$, $SiO_xF_y$ and the like can be provided.

Further, the barrier film 25-1 can contain a material selected from a group consisting of $α_xO_y$, $α_xSi_yO_z$, $α_xC_yO_z$ and $α_xF_yO_z$ as a main component. In this case, a indicates the preset metal element α.

Thus, since the barrier film ($Mn_xSi_yO_z$ film) 25-1 is an oxide film, it is not oxidized any more. Therefore, the oxidation resistance of the aerial wirings W1, W2 can be enhanced and the aerial wirings W1, W2 can be protected from being oxidized.

Further, since a continuous and fine reaction-formed film which is no more oxidized is attained, it prevents water from being passed therethrough. Therefore, the water resistance of the wiring layers W1, W2 can be enhanced.

<Manufacturing Method>

Next, a manufacturing method of the semiconductor device is explained with reference to FIGS. 3 to 5 by taking the semiconductor device shown in FIGS. 1 and 2 as an example. In this explanation, the manufacturing processes for forming element isolation regions and metal oxide semiconductor field effect transistors (MOSFETs) are omitted in the drawing.

First, an element structure such as a MOSFET structure is formed on a semiconductor substrate by use of a known manufacturing process. Then, SiOC or the like is deposited to cover the element structure and form an inter-level insulating film (not shown) by use of a chemical vapor deposition (CVD) method, for example.

Figure 3:
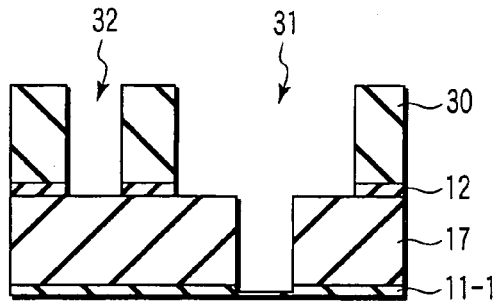
FIG. 3 is a cross-sectional view showing one manufacturing step of the semiconductor device according to the first embodiment of this invention.
Figure 4:
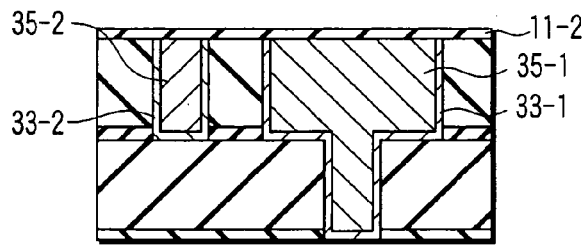
FIG. 4 is a cross-sectional view showing one manufacturing step of the semiconductor device according to the first embodiment of this invention.

Next, as shown in FIG. 3, a porous Si film containing at least Si (silicon) in the composition thereof is deposited to form a porous film 11-1 on the inter-level insulating film by use of the CVD method. Then, for example, an SiOC film or the like is deposited on the porous film 11-1 to form an inter-level insulating film 17 by use of the CVD method. Further, an SiC film, SiCN film or the like is deposited to form an etching stopper film 12 on the inter-level insulating film 17 by use of the CVD method, for example.

Then, an Si-series resist film is deposited to form an insulating film 30 by use of the CVD method, for example. In this case, the insulating film 30 is not limited to the Si-series resist film and a material which can be eliminated by an etching process in a gaseous atmosphere containing at least $O_2$ and contains at least Si in the composition thereof can be used. For example, a sealing film having an Si containing thin insulating film formed to cover a portion of a resist film having Si doped therein by silicifying, a polyarylene ether film having Si doped therein by silicifying, or a resist film or polyarylene ether film which faces the grooves for the wirings can be used.

Next, photoresist is coated on the insulating film 30 and the thus formed photoresist film is subjected to the exposing and developing processes. Thus, the patterning process is performed to expose the surface of a portion of the insulating film 30 which corresponds in position to the via layer 23-1. Further, an anisotropic etching process such as a reactive ion etching (RIE) process is performed to etch the structure to the surface of the etching stopper film 12 with the thus patterned photoresist film used as a mask (not shown).

Then, after the photoresist film is removed by ashing or the like, photoresist is further coated on the insulating film 30 and the thus formed photoresist film is subjected to the exposing and developing processes. Thus, the patterning process is performed to expose the surface of portions of the insulating film 30 which correspond in position to the wiring layers 22-1, 22-2. Further, an anisotropic etching process such as an RIE process is performed to etch the structure to the surface of the inter-level insulating film 17 so as to form grooves 31, 32 for wirings with the thus patterned photoresist film used as a mask.

Next, CuMn alloy layers 33-1, 33-2 are formed on the inner walls of the grooves 31, 32 for wirings by use of a physical vapor deposition (PVD) method or CVD method, for example. After this, CuMn alloy layers 35-1, 35-2 are formed on the CuMn alloy layers 33-1, 33-2 by use of a plating method, for example. Further, the CuMn alloy layers 33-1, 33-2, 35-1, 35-2 are polished to the surface of the insulating film 30 and made flat by use of a chemical mechanical polishing method (CMP). Then, a porous Si film or the like is deposited to form a porous insulating film 11-2 on the thus flattened CuMn alloy layers 33-1, 33-2, 35-1, 35-2 and insulating film 30 by use of the CVD method. In this case, it is required for the porous film 11-2 to contain at least Si in the composition.

Figure 5:
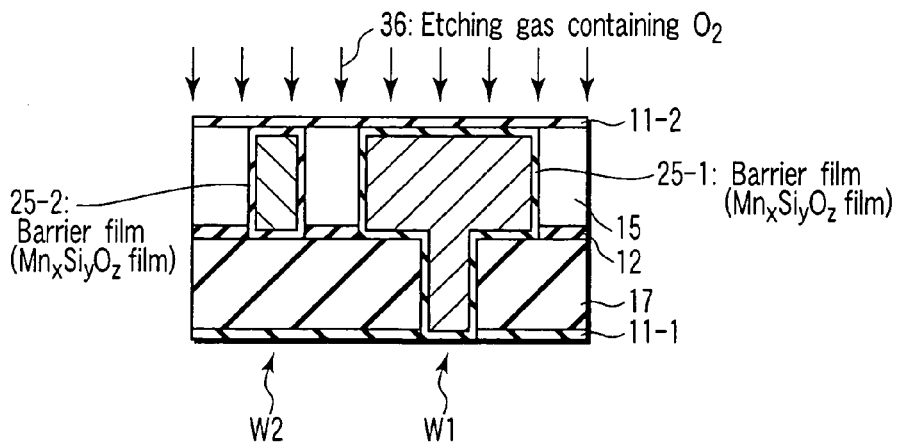
FIG. 5 is a cross-sectional view showing one manufacturing step of the semiconductor device according to the first embodiment of this invention.

Next, as shown in FIG. 5, an etching process is performed through the porous film 11-2 in a gaseous atmosphere 36 containing $O_2$ to remove a portion of the insulating film 30 between the wirings and form an air gap 15.

In this case, at the time of the above etching process, the heat treatment is performed for 30 to 60 min to set the substrate temperature at 200 to 600° C. By the heat treatment, Mn elements in the CuMn alloy layers 33-1, 33-2, 35-1, 35-2 are diffused to react with Si elements in the insulating film 30, inter-level insulating film 17 and porous films 11-1, 11-2 and O elements in the etching gas 36 to form uniform $Mn_xSi_yO_z$ films (barrier films) 25-1, 25-2 with extremely small film thickness (2 to 3 nm) in a self-alignment fashion so as to cover the surfaces thereof.

It is possible to precipitate almost all of the Mn elements in the CuMn alloy layers 35-1, 35-2 by suitably selecting the concentration of the Mn elements and the reaction condition of the heat treatment process. In this case, the wiring layers 22-1, 22-2 and via layer 23-1 can be formed of pure Cu.

Further, by repeatedly performing the above manufacturing process, a multilayer wiring structure having an air gap structure with a desired number of layers can be formed. By the above manufacturing method, the semiconductor device shown in FIGS. 1 and 2 is manufactured.

As described above, according to the semiconductor device and the manufacturing method of this embodiment, the following effects (1) to (5) can be attained.

(1) The oxidation resistance of the aerial wirings W1, W2 can be enhanced and oxidation and corrosion of the aerial wirings W1, W2 can be prevented to enhance the reliability.

Since the barrier films ($Mn_xSi_yO_z$ films) 25-1, 25-2 are oxide films, they cannot be oxidized any more. Therefore, the barrier films 25-1, 25-2 can be prevented from being oxidized and corroded by oxidation gas in the etching gas 36 in the etching process so that the wiring layers 22-1, 22-2 and via layer 23-1 contained therein can be prevented from being oxidized and corroded.

Further, since the barrier films 25-1, 25-2 can prevent penetration of oxidation gas generated in the oxidation atmosphere at the LSI operation time even after the aerial wirings W1, W2 are temporarily formed, oxidation and corrosion of the aerial wirings W1, W2 can be prevented.

Thus, the reliability of the aerial wirings W1, W2 can be enhanced.

(2) The water resistance of the aerial wirings W1, W2 can be enhanced.

Since the barrier films 25-1, 25-2 are each formed of a continuous and fine reaction-formed film, they prevent water from being passed therethrough. Particularly, the inter-level insulating film 17 is formed of an SiOC film or the like which is one type of an inter-level insulating film (a low-k film) with small dielectric constant, but the SiOC film with the small dielectric constant generally has a property that it will easily pass water in addition to the property that it tends to contain a large amount of water. However, since the barrier film 25-1 is formed on the surface of the via layer 23-1, penetration of water can be prevented.

Therefore, the water resistance of the wiring layers W1, W2 can be enhanced.

(3) The mechanical strength of the aerial wirings W1, W2 is high.

The air gap 15 is provided only between the wiring layers 22-1 and 22-2 and the inter-level insulating film 17 which is a solid body is filled between the via layers 23-1. Therefore, occurrence of cracks in the aerial wirings W1, W2 can be prevented and the mechanical strength thereof becomes high.

(4) The capacitance between the wirings can be reduced and the delay time caused by the aerial wirings W1, W2 can be reduced.

The wiring layers 22-1, 22-2 are provided in the air gap 15. In the air gap 15, for example, gas such as air is filled and the relative dielectric constant of air is smaller than that of a solid material such as an insulating material and is set to approximately 1.0. Further, it is known that the capacitance between the wirings increases with an increase in the relative dielectric constant of a portion between the wirings.

Therefore, the capacitances of the wiring layers 22-1, 22-2 in the air gap 15 can be reduced and the delay time in the aerial wirings W1, W2 can be reduced.

(5) It is advantageous in reducing the manufacturing cost.

As described above, the etching process and the heat treatment are simultaneously performed, the insulating film 30 is removed by use of the etching gas 36 in the etching process to form the air gap 15 and, at the same time, O elements required for forming the barrier films 25-1, 25-2 can be supplied. Therefore, the air gap 15 and the barrier films 25-1, 25-2 can be simultaneously formed.

Thus, since the number of manufacturing steps is reduced to simply the manufacturing process, it is advantageous in reducing the manufacturing cost.

[Modification 1 (Example of Formation of Air Gap after Formation of Barrier Film)]

Next, a manufacturing method of a semiconductor device according to a modification 1 of this invention is explained with reference to FIGS. 6 and 7. The manufacturing method of the semiconductor device according to the modification 1 relates to a case wherein an air gap is formed after a barrier film is first formed. In this explanation, the explanation for portions which have been explained in the first embodiment is omitted.

Since the configuration of the semiconductor device according to the modification 1 is the same as that of the semiconductor device according to the first embodiment shown in FIGS. 1 and 2, the explanation thereof is omitted.

<Manufacturing Method>

First, an element structure such as a MOSFET structure is formed on a semiconductor substrate by use of a known manufacturing method. Then, SiOC or the like is deposited to cover the element structure and form an inter-level insulating film (not shown) by use of the CVD method, for example.

Figure 6:
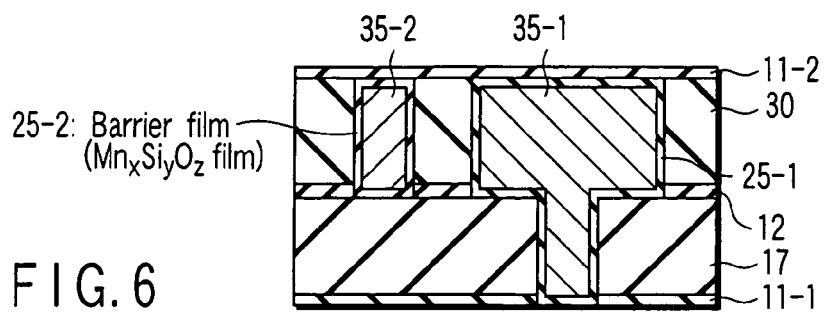
FIG. 6 is a cross-sectional view showing one manufacturing step of a semiconductor device according to a modification 1 of this invention.

Next, as shown in FIG. 6, a porous film 11-1, inter-level insulating film 17, etching stopper film 12 and insulating film 30 are sequentially formed on the inter-level insulating film by use of the same manufacturing method as that of the first embodiment. After this, grooves for wirings are formed in the laminated film.

Then, CuMn alloy layers are formed on the inner walls of the grooves for wirings by use of the PVD or CVD method, for example. After this, CuMn alloy layers 35-1, 35-2 are formed on the CuMn alloy layers by use of the plating method, for example. The CuMn alloy layers 35-1, 35-2 are polished to the surface of the insulating film 30 and made flat by use of the CMP method and a porous film 11-2 is formed on the thus flattened CuMn alloy layers 35-1, 35-2 and insulating film 30.

Next, the heat treatment is performed for 30 to 60 min to set the substrate temperature at 200 to 600° C. By the heat treatment, Mn elements in the CuMn alloy layers 35-1, 35-2 are diffused to react with O elements and Si elements in the insulating film 30, inter-level insulating film 17 and porous films 11-1, 11-2 to form uniform $Mn_xSi_yO_z$ films (barrier films) 25-1, 25-2 with extremely small film thickness (2 to 3 nm) in a self-alignment fashion so as to cover the surfaces thereof.

It is possible to precipitate almost all of the Mn elements in the CuMn alloy layers 35-1, 35-2 by suitably selecting the concentration of the Mn elements and the reaction condition of the heat treatment process. In this case, the wiring layers 22-1, 22-2 and via layer 23-1 can be formed of pure Cu.

Figure 7:
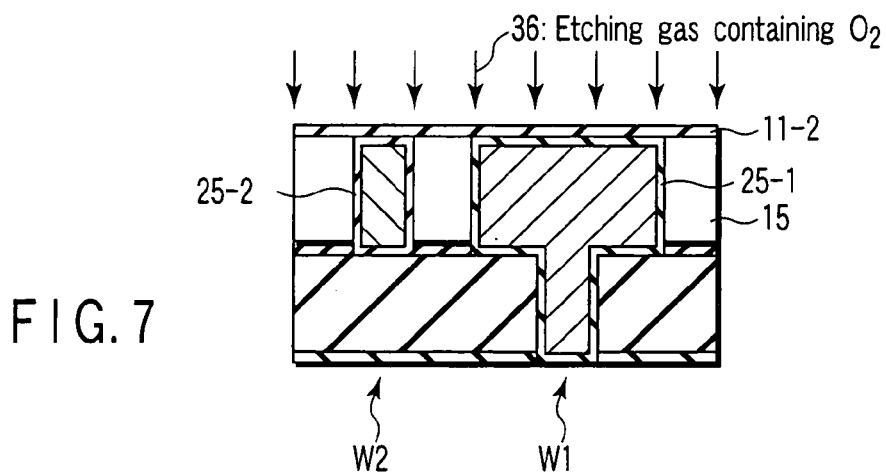
FIG. 7 is a cross-sectional view showing one manufacturing step of the semiconductor device according to the modification 1 of this invention.

Then, as shown in FIG. 7, an etching process is performed through the porous film 11-2 in a gaseous atmosphere containing $O_2$ to remove portions of the insulating film 30 which lie between the wirings and form an air gap 15.

Further, by repeatedly performing the above manufacturing process, a multilayer wiring structure having an air gap structure with a desired number of layers can be formed. By the above manufacturing method, the semiconductor device shown in FIGS. 1 and 2 is manufactured.

As described above, according to the semiconductor device and the manufacturing method of this embodiment, the same effects as effects (1) to (5) can be attained.

Further, in the manufacturing method of the semiconductor device according to the modification 1, the insulating film 30 is selectively removed by performing the etching process to form the air gap 15 after the barrier films 25-1, 25-2 are formed by the heat treatment process.

Thus, the manufacturing steps of forming the barrier films 25-1, 25-2 and forming the air gap 15 can be independently performed. Therefore, the manufacturing steps can be performed with the optimum gas condition and temperature condition adequately set in the respective manufacturing steps. As a result, the film quality of the barrier films 25-1, 25-2 can be further enhanced and the quality of gas which occupies the air gap 15 can be enhanced.

Second Embodiment (Example in which Wiring Layers and Via Layers are Provided in Air Gap)

Next, a semiconductor device according to a second embodiment of this invention is explained with reference to FIG. 8. The semiconductor device according to the second embodiment relates to a case wherein wiring layers and via layers are formed in an air gap. In this explanation, the explanation for portions which have been explained in the first embodiment is omitted.

Figure 8:
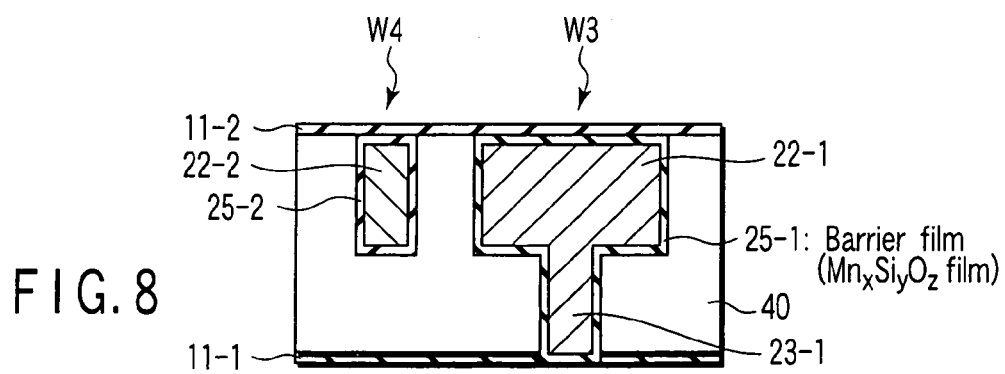
FIG. 8 is a cross-sectional view showing a semiconductor device according to a second embodiment of this invention.

As shown in FIG. 8, the present embodiment is different from the first embodiment in that an etching stopper film is not formed and wiring layers 22-1, 22-2 and via layer 23-1 of aerial wirings W3, W4 are formed in an air gap 40.

That is, the aerial wiring W3 includes the wiring layer 22-1 formed in the air gap 40 and containing Cu as a main component and the via layer 23-1 electrically connected to the wiring layer 22-1, formed in the air gap 40 and containing Cu as a main component.

The aerial wiring W4 includes the wiring layer 22-2 formed in the air gap 40 and containing Cu as a main component. In the cross section, a via layer of the aerial wiring W4 is not shown.

<Manufacturing Method>

Next, a manufacturing method of the semiconductor device according to the present embodiment is explained with reference to FIGS. 9 to 11 by taking the semiconductor device shown in FIG. 8 as an example. In this explanation, the process for manufacturing element isolation regions and MOSFETs is not shown in the drawing.

First, an element structure such as a MOSFET structure is formed on a semiconductor substrate by use of a known manufacturing method. Then, SiOC or the like is deposited to cover the element structure and form an inter-level insulating film (not shown) by use of the CVD method, for example.

Figure 9:
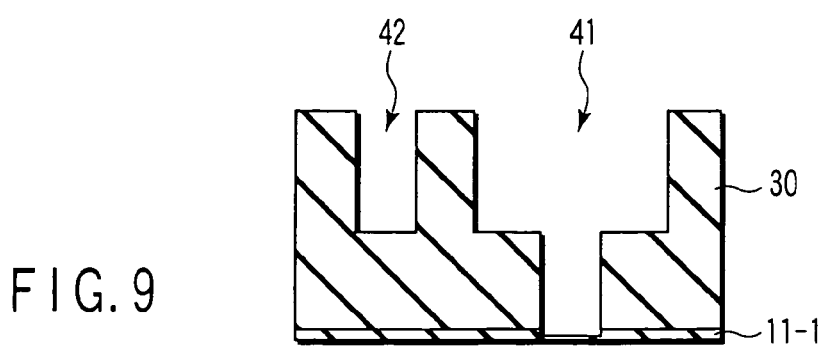
FIG. 9 is a cross-sectional view showing one manufacturing step of the semiconductor device according to the second embodiment of this invention.

After this, as shown in FIG. 9, a porous Si film containing at least Si in the composition is deposited to form a porous film 11-1 on the inter-level insulating film by use of the CVD method, for example.

Next, an Si-series resist film is deposited on the porous film 11-1 to form an insulating film 30 by use of the CVD method, for example. The insulating film 30 is not limited to the Si-series resist film. For example, a material which can be removed by an etching process using a gaseous atmosphere containing at least $O_2$ and contains at least Si in the composition can be applied. For example, a sealing film having an Si containing thin insulating film formed to cover a portion of a resist film having Si doped therein by silicifying, a polyarylene ether film having Si doped therein by silicifying, or a resist film or polyarylene ether film which faces the groove for the wiring can be used.

Then, grooves 41, 42 for wirings are formed by use of the manufacturing method which is substantially the same as that of the first embodiment.

Figure 10:
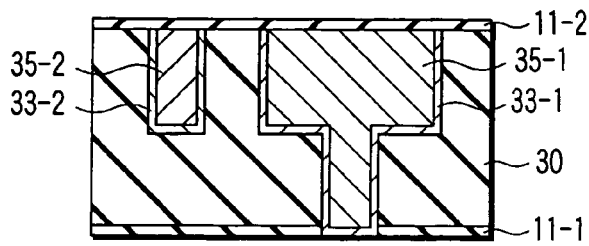
FIG. 10 is a cross-sectional view showing one manufacturing step of the semiconductor device according to the second embodiment of this invention.

Next, as shown in FIG. 10, CuMn alloy layers 33-1, 33-2 are formed on the inner walls of the grooves 41, 42 for wirings by use of the PVD method or CVD method, for example. After this, CuMn alloy layers 35-1, 35-2 are formed on the CuMn alloy layers 33-1, 33-2 by use of the plating method, for example. The CuMn alloy layers 33-1, 33-2, 35-1, 35-2 are polished to the surface of the insulating film 30 and made flat by use of the CMP method. Then, a porous insulating film 11-2 is formed by depositing a porous Si film or the like on the thus flattened CuMn alloy layers 33-1, 33-2, 35-1, 35-2 and insulating film 30. The porous film 11-2 is required to contain at least Si in the composition.

Figure 11:
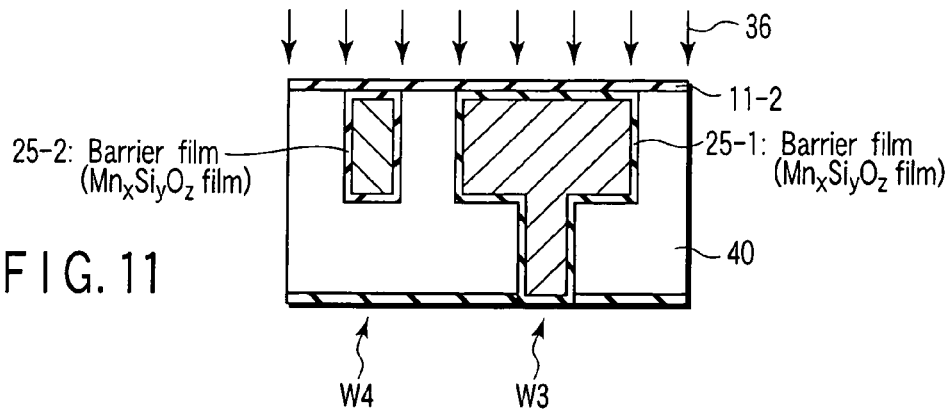
FIG. 11 is a cross-sectional view showing one manufacturing step of the semiconductor device according to the second embodiment of this invention.

Next, as shown in FIG. 11, an etching process is performed through the porous film 11-2 in a gaseous atmosphere 36 containing $O_2$ to remove portions of the insulating film 30 which lie between the wirings and form an air gap 40.

At the time of the above etching process, the heat treatment is performed for 30 to 60 min to set the substrate temperature at 200 to 600° C. By the heat treatment, Mn elements in the CuMn alloy layers 33-1, 33-2, 35-1, 35-2 are diffused to react with Si elements in the insulating film 30 and porous films 11-1, 11-2 and O elements in the etching gas to form uniform $Mn_xSi_yO_z$ films (barrier films) 25-1, 25-2 with extremely small film thickness (2 to 3 nm) in a self-alignment fashion so as to cover the surfaces thereof.

It is possible to precipitate almost all of the Mn elements in the CuMn alloy layers 35-1, 35-2 by suitably selecting the concentration of the Mn elements and the reaction condition of the heat treatment process. In this case, the wiring layers 22-1, 22-2 and via layer 23-1 can be formed of pure Cu.

Further, by repeatedly performing the above manufacturing process, a multilayer wiring structure having an air gap structure with a desired number of layers can be formed. By the above manufacturing method, the semiconductor device shown in FIG. 8 is manufactured.

As described above, according to the semiconductor device and the manufacturing method of this embodiment, the same effects as effects (1), (2), (4) and (5) can be attained.

Further, in the semiconductor device according to the present embodiment, the wiring layers 22-1, 22-2 and the via layer 23-1 are formed in the air gap 40.

Therefore, by reducing the relative dielectric constant of a portion between the wirings, an advantage that the capacitance can be reduced and the delay time of the aerial wirings W1, W2 can be reduced can be attained.

In the present embodiment, an etching stopper film (middle stopper film) is not used between the wiring-wiring insulating film and the via-via insulating film, but in the structure in which the etching stopper film is used, the same effect can be attained.

[Modification 2 (Example of Formation of Air Gap after Formation of Barrier Film)]

Next, a manufacturing method of a semiconductor device according to a modification 2 of this invention is explained with reference to FIGS. 12, 13. The manufacturing method of the semiconductor device according to the modification 2 relates to a case wherein an air gap is formed after a barrier film is first formed. In this explanation, the explanation for portions which have been explained in the second embodiment is omitted.

<Manufacturing Method>

First, an element structure such as a MOSFET structure is formed on a semiconductor substrate by use of a known manufacturing method. Then, SiOC or the like is deposited to cover the element structure and form an inter-level insulating film (not shown) by use of the CVD method, for example.

Figure 12:
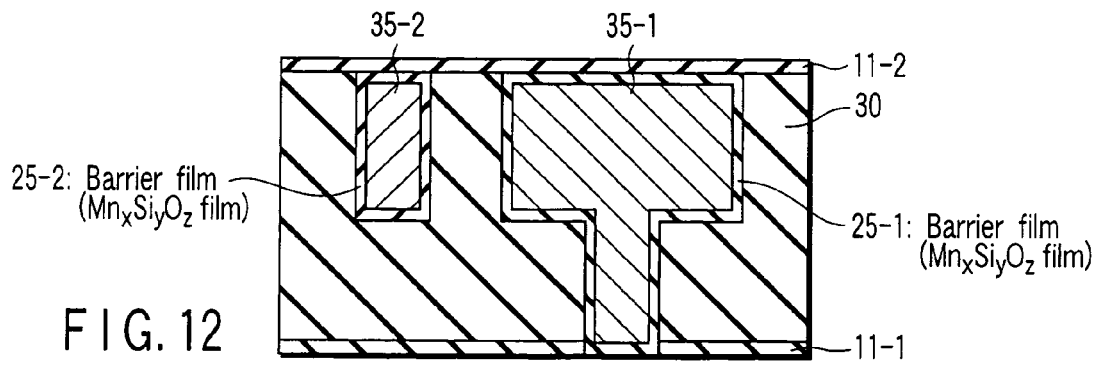
FIG. 12 is a cross-sectional view showing one manufacturing step of a semiconductor device according to a modification 2 of this invention.

Next, as shown in FIG. 12, a porous film 11-1 and insulating film 30 are sequentially formed on the inter-level insulating film by use of the same manufacturing method as that of the second embodiment and grooves for wirings are formed in the laminated film.

Then, CuMn alloy layers are formed on the inner walls of the grooves for wirings by use of the PVD method or CVD method, for example. After this, CuMn alloy layers 35-1, 35-2 are formed on the CuMn alloy layers by use of the plating method, for example. The CuMn alloy layers 35-1, 35-2 are polished to the surface of the insulating film 30 and made flat by use of the CMP method and a porous film 11-2 is formed on the thus flattened CuMn alloy layers 35-1, 35-2.

Next, the heat treatment is performed for 30 min to 60 min to set the substrate temperature at 200 to 600° C. By the heat treatment, Mn elements in the CuMn alloy layers 35-1, 35-2 are diffused to react with O elements and Si elements in the insulating film 30 and porous films 11-1, 11-2 to form uniform $Mn_xSi_yO_z$ films (barrier films) 25-1, 25-2 with extremely small film thickness (2 to 3 nm) in a self-alignment fashion so as to cover the surfaces thereof.

It is possible to precipitate almost all of the Mn elements in the CuMn alloy layers 35-1, 35-2 by suitably selecting the concentration of the Mn elements and the reaction condition of the heat treatment process. In this case, the wiring layers 22-1, 22-2 and via layer 23-1 can be formed of pure Cu.

Figure 13:
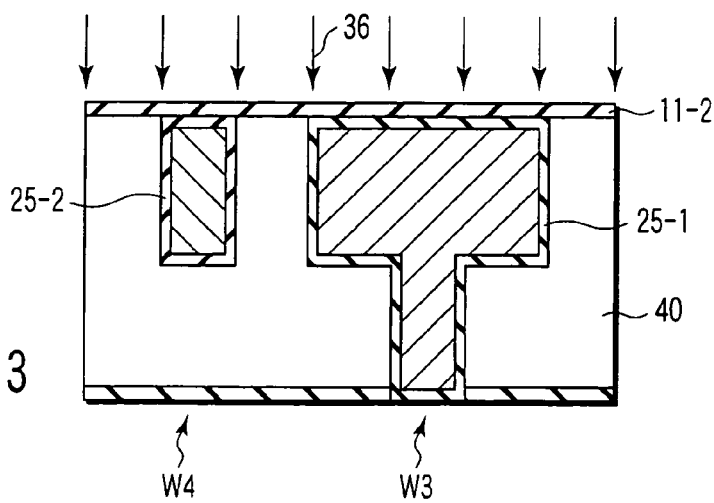
FIG. 13 is a cross-sectional view showing one manufacturing step of the semiconductor device according to the modification 2 of this invention.

Then, as shown in FIG. 13, an etching process is performed through the porous film 11-2 in a gaseous atmosphere 36 containing $O_2$ to remove portions of the insulating film 30 which lie between the wirings and form an air gap 40.

Further, by repeatedly performing the above manufacturing process, a multilayer wiring structure having an air gap structure with a desired number of layers can be formed. By the above manufacturing method, the semiconductor device shown in FIG. 8 is manufactured.

As described above, according to the semiconductor device and the manufacturing method of this embodiment, the same effects as effects (1), (2), (4) and (5) can be attained.

Further, in the manufacturing method of the semiconductor device according to the modification 2, the barrier films 25-1, 25-2 are first formed by the heat treatment process and the air gap 40 is formed by the etching process.

Thus, the manufacturing steps of forming the barrier films 25-1, 25-2 and forming the air gap 40 can be independently performed. Therefore, the manufacturing steps can be performed with the optimum gas condition and temperature condition adequately set in the respective manufacturing steps. As a result, an advantage that the film quality of the barrier films 25-1, 25-2 can be further enhanced and the quality of gas in the air gap 40 can be enhanced can be attained.

[Modification 3]

Next, a the manufacturing method of a semiconductor device according to a modification 3 is explained with reference to FIGS. 14 to 16. In this explanation, the explanation for portions which have been explained in the second embodiment is omitted.

Since the structure of the semiconductor device according to the modification 3 is the same as that of the semiconductor device according to the second embodiment, the detail explanation thereof is omitted.

<Manufacturing Method>

First, an element structure such as a MOSFET structure is formed on a semiconductor substrate by use of a known manufacturing process. Then, SiOC or the like is deposited to cover the element structure and form an inter-level insulating film (not shown) by use of the CVD method, for example.

Figure 14:
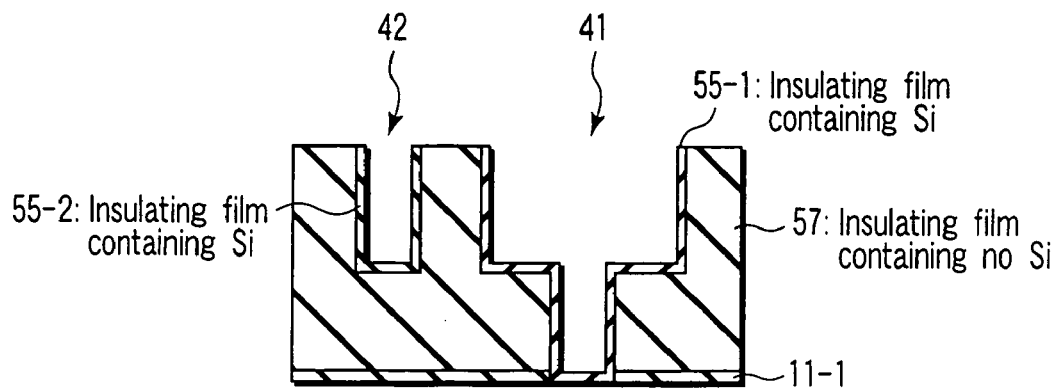
FIG. 14 is a cross-sectional view showing one manufacturing step of a semiconductor device according to a modification 3 of this invention.

Next, as shown in FIG. 14, a porous film 11-1 is formed on the inter-level insulating film by use of the same manufacturing method as that used in the second embodiment.

Then, an insulating film 57 which contains no Si is formed on the porous film 11-1 by use of the CVD method, for example. The insulating film 57 which contains no Si is a resist film containing no Si, polyarylene ether film or the like.

After this, grooves 41, 42 for wirings are formed in the insulating film 57 by use of the same manufacturing process as that used in the second embodiment.

Next, thin insulating films 55-1, 55-2 containing Si are formed on the inner walls of the grooves 41, 42 for wirings by use of the CVD method, for example. The insulating films 55-1, 55-2 containing Si are an $SiO_2$ film, SiF film, SiOC film, SiC film, SiCN film, SiN film or the like, for example.

Further, CuMn alloy layers acting as seed layers are formed on the insulating films 55-1, 55-2 by use of the PVD method or CVD method, for example (not shown).

Figure 15:
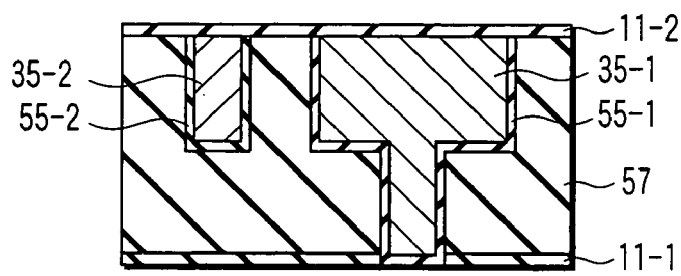
FIG. 15 is a cross-sectional view showing one manufacturing step of the semiconductor device according to the modification 3 of this invention.

Then, as shown in FIG. 15, CuMn alloy layers 35-1, 35-2 are formed on the CuMn alloy layers by use of the plating method, for example. Further, the CuMn alloy layers 35-1, 35-2 are polished to the surface of the insulating film 57 and made flat by use of the CMP method. After this, a porous film 11-2 is formed on the thus flattened CuMn alloy layers 35-1, 35-2. In this case, the CuMn alloy layers acting as the seed layers are integrated with the respective CuMn alloy layers 35-1, 35-2 in some cases.

Figure 16:
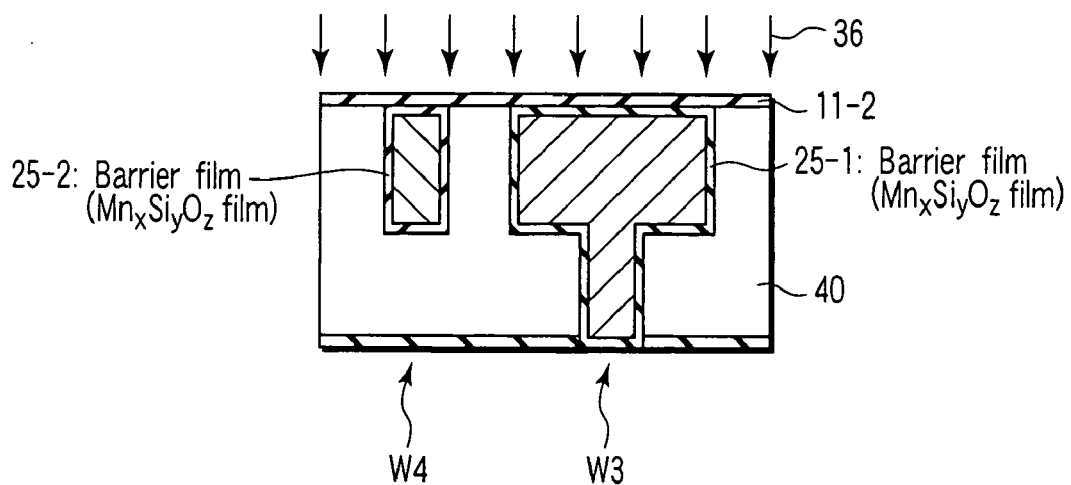
FIG. 16 is a cross-sectional view showing one manufacturing step of the semiconductor device according to the modification 3 of this invention.

Next, as shown in FIG. 16, an etching process is performed through the porous film 11-2 in a gaseous atmosphere 36 containing $O_2$ to remove a portion of the insulating film 57 which lies between the wirings and form an air gap 40.

In this case, at the time of the above etching process, the heat treatment is performed for 30 min to 60 min to set the substrate temperature at 200° C. to 600° C. By the heat treatment, Mn elements in the CuMn alloy layers 35-1, 35-2 are diffused to react with Si elements in the insulating films 55-1, 55-2 and porous films 11-1, 11-2 and O elements in the etching gas 36 to form uniform $Mn_xSi_yO_z$ films (barrier films) 25-1, 25-2 with extremely small film thickness (2 nm to 3 nm) in a self-alignment fashion so as to cover the surfaces thereof.

It is possible to precipitate almost all of the Mn elements in the CuMn alloy layers 35-1, 35-2 by suitably selecting the concentration of the Mn elements and the reaction condition of the heat treatment process. In this case, the wiring layers 22-1, 22-2 and via layer 23-1 can be formed of pure Cu.

Further, by repeatedly performing the above manufacturing process, a multilayer wiring structure having an air gap structure with a desired number of layers can be formed. By the above manufacturing method, the semiconductor device shown in FIG. 8 is manufactured.

As described above, according to the semiconductor device and the manufacturing method of this embodiment, the same effects as the effects (1), (2), (4) and (5) can be attained.

Further, in the manufacturing method of the semiconductor device according to the modification 3, the insulating films 55-1, 55-2 containing Si are formed on the inner walls of the grooves 41, 42. The O elements required for forming the barrier films 25-1, 25-2 are supplied from the etching gas 36 used in the etching process. On the other hand, the Mn elements are supplied by diffusing Mn elements from the CuMn alloy layers 35-1, 35-2 to the peripheral regions in the heat treatment process which is performed at the same time as the above etching process.

Therefore, the insulating film 57 removed at the time of the etching process can be formed of an insulating film which contains no Si since it is not necessary for the insulating film to supply elements required for forming the barrier films 25-1, 25-2. Thus, it is advantageous in widening the selection range of insulating materials for the insulating film 57 to be etched.

One example of the insulating films 55-1, 55-2, 57 is explained by taking a case wherein the wiring layers and via layers according to the second embodiment and modification 2 are formed in the air gap as an example. However, the insulating films 55-1, 55-2, 57 can also be applied to a case wherein the wiring layers according to the first embodiment and modification 1 are formed in the air gap.

Further, in the wiring structure shown in the first embodiment and modification 1, the types of the insulating films for the wiring layers and via layers are different, but the two insulating films can be formed of the same type. In addition, the wiring groove is formed in a dual damascene form, but the same effect can be attained even if it is formed in a single damascene form.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
  a first aerial wiring which comprises
    a first wiring layer formed in an air gap and comprising Cu as a main component, and
    a via layer
      electrically connected to the first wiring layer,
      formed in an inter-level insulating film comprising a preset constituent element, and
      comprising Cu as a main component;
  a first porous film formed on the first aerial wiring;
  a first barrier film formed to cover the surface of the first aerial wiring, comprising a compound of the preset constituent element and a preset metal element as a main component;
wherein
  the preset metal element comprises at least one element selected from the group consisting of Mn, Nb, Zr, Cr, V, Y, Tc and Re, and the preset constituent element comprises O and at least one element selected from the group consisting of Si, C and F.

2. The semiconductor device according to claim 1, further comprising an etching stopper film formed on the inter-level insulating film.

3. The semiconductor device according to claim 1, further comprising a second porous film formed on the bottom surface of the inter-level insulating film.

4. The semiconductor device according to claim 1, further comprising a second aerial wiring having a second wiring layer formed in the air gap and comprising Cu as a main component; and
  a second barrier film formed to cover the surface of the second aerial wiring and comprising a compound of the preset constituent element and a preset metal element as a main component.

5. The semiconductor device according to claim 1, wherein the first porous film comprises a porous Si film.

6. The semiconductor device according to claim 1, wherein the inter-level insulating film has an SiOC film.

7. The semiconductor device according to claim 2, wherein the etching stopper film has one of an SiC film and SiCN film.

8. The semiconductor device according to claim 3, wherein each of the first and second porous films comprises a porous Si film.

9. The semiconductor device according to claim 4, wherein the preset metal element of the second barrier film comprises at least one element selected from a group consisting of Mn, Nb, Zr, Cr, V, Y, Tc and Re, and the preset constituent element comprises O and at least one element selected from a group consisting of Si, C and F.

10. A semiconductor device comprising:
  a first aerial wiring which comprises
    a first wiring layer formed in an air gap and comprising Cu as a main component and
    a via layer
      electrically connected to the first wiring layer,
      formed in the air gap, and
      comprising Cu as a main component;
  a first porous film formed on the first aerial wiring;
  a first barrier film formed to cover the surface of the first aerial wiring, comprising a compound of a preset constituent element and a preset metal element as a main component;

wherein
the preset metal element comprises at least one element selected from the group consisting of Mn, Nb, Zr, Cr, V, Y, Tc and Re, and the preset constituent element comprises O and at least one element selected from the group consisting of Si, C and F.

11. The semiconductor device according to claim 10, further comprising a second porous film formed on the bottom surface of the first aerial wiring.

12. The semiconductor device according to claim 10, further comprising a second aerial wiring having a second wiring layer formed in the air gap and comprising Cu as a main component; and
a second barrier film formed to cover the surface of the second aerial wiring and comprising the compound of the preset constituent element and the preset metal element as a main component.

13. The semiconductor device according to claim 10, wherein the first porous films comprises a porous Si film.

14. The semiconductor device according to claim 11, wherein each of the first and second porous films comprises a porous Si film.

15. The semiconductor device according to claim 12, wherein the preset metal element of the second barrier film comprises at least one element selected from a group consisting of Mn, Nb, Zr, Cr, V, Y, Tc and Re, and the preset constituent element comprises O and at least one element selected from a group consisting of Si, C and F.

* * * * *